METHOD OF FABRICATING SEMICONDUCTOR DEVICES

Filed April 26, 1967

3 Sheets-Sheet 1

INVENTORS
EDGAR T. CASTERLINE &
RONALD ROSENZWEIG
BY M. Y. Epstein
ATTORNEY

METHOD OF FABRICATING SEMICONDUCTOR DEVICES

Filed April 26, 1967 3 Sheets-Sheet 2

INVENTORS
EDGAR T. CASTERLINE &
RONALD ROSENZWEIG
BY M. Y. Epstein
ATTORNEY

INVENTORS
EDGAR T. CASTERLINE &
RONALD ROSENZWEIG
BY M. Y. Epstein
ATTORNEY

United States Patent Office 3,513,022

Patented May 19, 1970

3,513,022

METHOD OF FABRICATING SEMICONDUCTOR DEVICES

Edgar T. Casterline, Bound Brook, N.J., and Ronald Rosenzweig, New York, N.Y., assignors to RCA Corporation, a corporation of Delaware Filed Apr. 26, 1967, Ser. No. 633,835

Int. Cl. H01l 7/66, 1/14

U.S. Cl. 117—212 5 Claims

ABSTRACT OF THE DISCLOSURE

A method of fabricating pellets having leads integral therewith for mounting the pellets in semiconductor device enclosures is disclosed. The method comprises providing a plurality of semiconductor devices on a semiconductor wafer, each device having a conductive contact to which an electrical connection from a terminal of the device enclosure is to be made. The wafer is coated with a layer of insulating material, and openings are made through the layer to uncover the device contacts. A layer of metal is then deposited onto the insulating material layer, the metal layer extending through the openings and into engagement with the contacts. Using photolithographic and etching processes, a plurality of leads are defined in the metal layer. The leads are preferably interdigitated, with the leads from each device extending beyond the edges of its device and over an adjacent device. The insulating material layer underlying the leads is then removed, and the wafer is segmented into individual pellets each having leads extending beyond the edges of the pellet.

BACKGROUND OF THE INVENTION

This invention relates to the fabrication of semiconductor devices, and has particular utility in the fabrication of high-power, high-frequency semiconductor devices. The invention herein described was made in the course of or under a contract or subcontract thereunder with the Department of the Air Force.

In the fabrication of semiconductor devices, e.g., transistors, it is the practice to provide rows and columns of spaced and discrete semiconductor device elements, referred to hereinafter simply as "devices," on a single semiconductor wafer. The wafer is thereafter diced to provide individual semiconductor device chips or pellets. Each pellet is then mounted within a device enclosure, and electrical connections are made between the pellet electrodes and terminals of the device.

One prior art practice has been to provide, in the form of a metal deposit on the surface of the wafer, thick "integral" leads which are connected to certain ones of the device electrodes and which extend beyond the edges of the devices. A pellet separating process is used which does not break the leads, thereby providing pellets having leads which extend beyond the pellet edges. In the mounting of the pellets, the extending leads are bonded directly to the device terminals. The leads are "integral" to the pellets in that they are formed as part of the pellet during the pellet fabrication process.

One problem associated with the prior art practice is that it is somewhat expensive. For example, the provision of the integral leads directly on the wafer surface takes up portions of the wafer surface and reduces the number of pellets that can be fabricated on a wafer of given size. This is undesirable since it increases the cost of the individual pellets. Further, the thick metal leads on the surface of the pellets provide excessive and undesirable capacitive coupling between different ones of the semiconductor device electrodes. In certain devices intended for use at high frequencies, for example, the capacitive coupling caused by the integral leads is so great as to make the use of integral leads in such devices entirely impractical.

SUMMARY OF THE INVENTION

A plurality of spaced devices are first provided on a semiconductor wafer. Each device has at least one conductive contact by means of which the device is connected to a terminal or lead. A layer of an electrically insulating material is applied onto the wafer surface, and openings are made through the insulating material layer to uncover or expose certain ones of the device contacts. Metal leads are then formed on top of the insulating material, with portions of the leads extending into the openings through the layer and into electrical contact with the previously uncovered contacts. Because of the underlying layer of insulating material, the lead from each device can extend over adjacent devices without becoming part of or connected to the adjacent devices. The insulating material layer is then removed from under the leads, and the wafer is segmented into individual pellets each having an extending lead.

Except where the leads are attached directly to the contacts, the leads can be lifted away from the surface of the pellets. The increased spacing thus provided between the leads and the surface of the pellets reduces the capacitive coupling between the pellet electrodes.

DESCRIPTION OF THE PREFERRED EMBODIMENTS

Figures 1, 2:
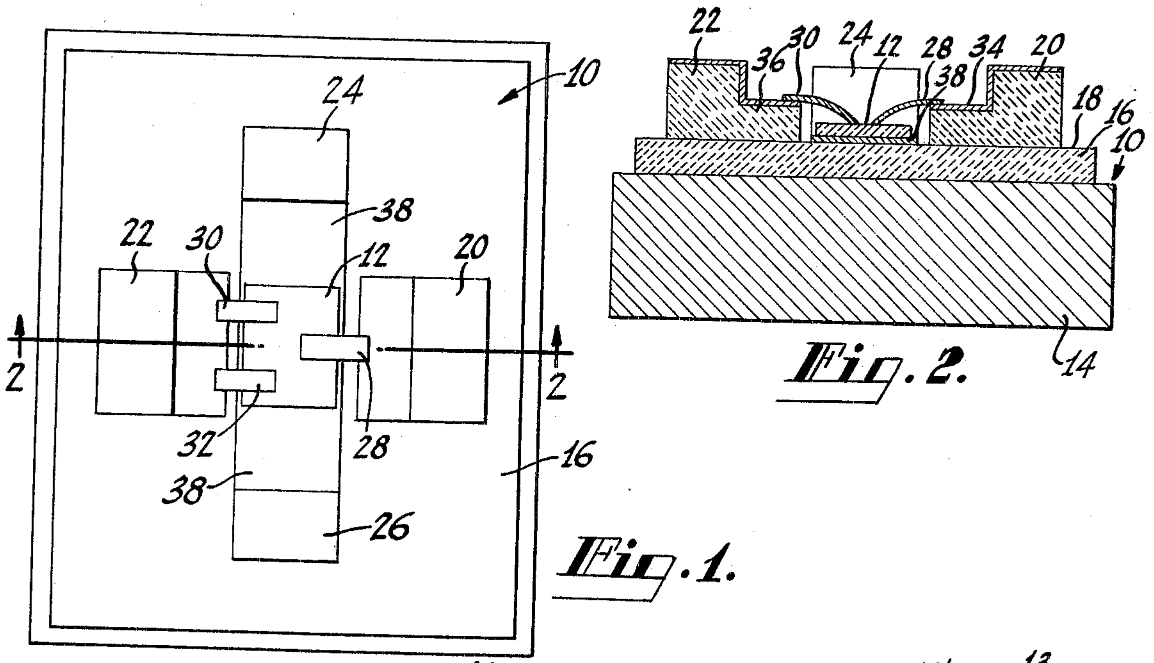
FIG. 1 is a plan view of a semiconductor device mount incorporating a semiconductor pellet made in accordance with the present invention.
FIG. 2 is a section along line 2—2 of FIG. 1.

A semiconductor device mount 10 including a semiconductor pellet 12 made in accordance with the present invention is shown in FIGS. 1 and 2. The mount 10 comprises a metal substrate 14 on which is mounted a ceramic platform 16. Mounted on the upper surface 18 of the platform 16 are four surface metallized ceramic blocks 20, 22, 24, and 26, and the semiconductor pellet 12. Two of the electrodes of the pellet are connected to the blocks 20 and 22 by means of a lead 28 and a pair of leads 30 and 32, respectively. The leads 28, 30, and 32 extend between and are bonded to the pellet electrodes and to ledges 34 and 36 of the blocks 20 and 22, respectively. As shown in FIG. 2, the leads 28, 30, and 32 form an angle with the surface of the pellet 12. The third electrode of the pellet 12 extends to the bottom surface of the pellet and is electrically connected to the blocks 24 and 26 by means of metallized areas 38 on the surface of the platform 16.

Figures 3, 4:
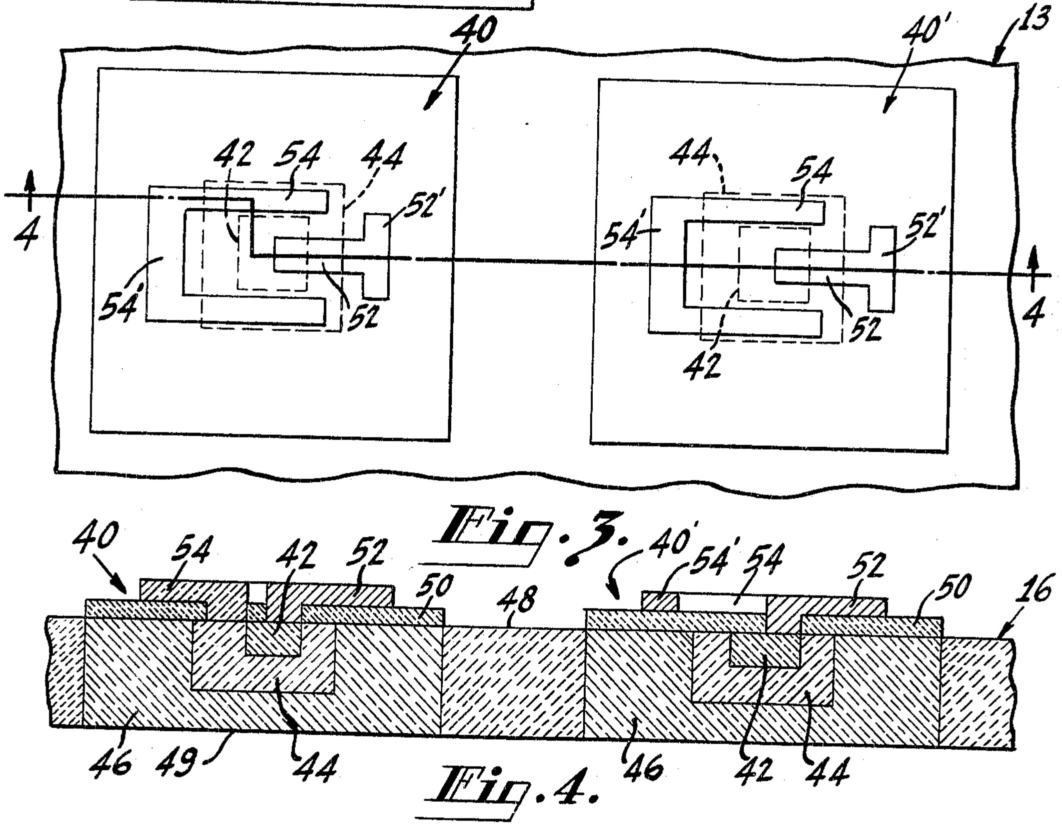
FIG. 3 is a plan view of a fragment of a semiconductor wafer at an intermediate stage in the fabrication of a pellet in accordance with the present invention.
FIG. 4 is a section along line 4—4 of FIG. 3.

The illustrative pellet 12 is fabricated as follows. Starting with a wafer 13 (FIG. 9) of a semiconductor material, e.g. silicon, a plurality of spaced and discrete semiconductor devices 40 and 40' are formed in rows and columns on the wafer. As shown in FIGS. 3 and 4, which show only two adjacent devices 40 and 40' on the wafer 13, each device comprises an emitter electrode 42 of N type conductivity, a base electrode 44 of P type conductivity, and a collector electrode 46 of N type conductivity. All the electrodes 42, 44, and 46 extend to the top surface 48 of the wafer, and the electrode 46 extends to the bottom surface 49 of the wafer. Covering substantially the entire top surface 48 of each device 40 and 40' is a layer 50 of an insulating material such as silicon dioxide. Overlying the layer 50, and extending through openings in the layer into electrical contact with the two electrodes 42 and 44, are two spaced electrically conductive areas or contacts 52 and 54, respectively. Each contact 52 and 54 has an enlarged area or bonding pad 52' and 54', respectively. The contacts can be of metal, such as aluminum, gold, nickel, or a highly doped semiconductor like silicon, or the like. In this embodiment, the contacts are of aluminum and have a thickness in the order of 15,000 angstroms.

Processes for forming devices of the type described on semiconductor wafers are known. See for example, U.S. Pat. 2,981,877 to Noyce, issued Apr. 25, 1961. Accordingly, description of the device-forming processes is omitted.

Figure 5:
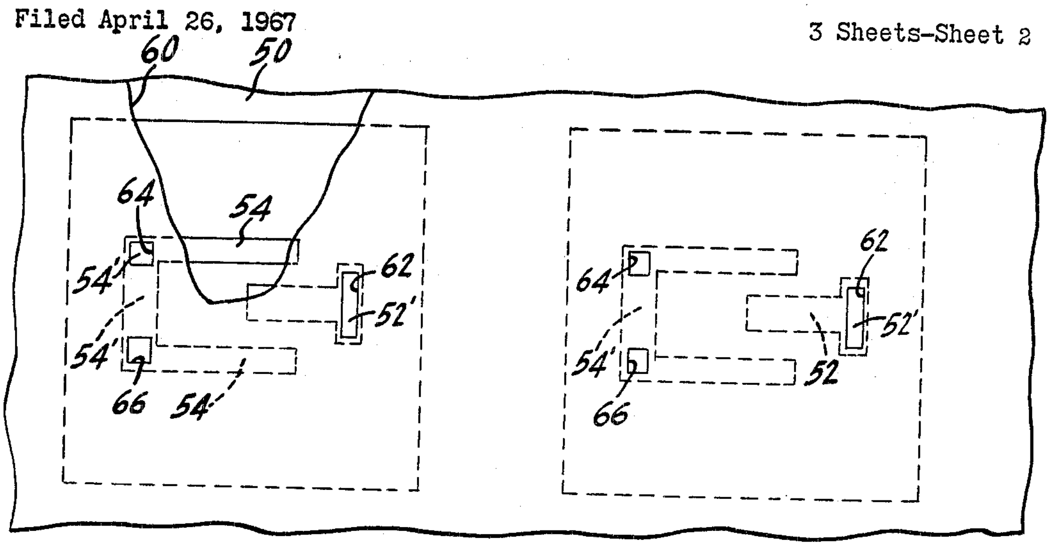
FIG. 5 is a view similar to FIG. 3 but at a later step in the processing of the wafer.

The surface of the wafer workpiece, that is, the upper surface of the various coatings or layers on the wafer substrate, is then completely covered with a layer 60 (FIG. 5) of an electrically insulating material of a type through which selective openings can be formed. Examples of such materials are silicon dioxide and silicon nitride. To selectively form openings through such materials, a conventional method is to cover the material with a photosensitive material layer, and use a photolithographic process and conventional etch technique. Since certain photosensitive materials, such as Kodak Photo Resist (KPR), are electrical insulators, a preferred method is to use such a photosensitive material for the layer 60.

Openings 62, 64, and 66 are then made through the layer 60 to uncover a portion of the bonding pad 52', and the two spaced portions of the bonding pad 54', respectively.

Figure 6:
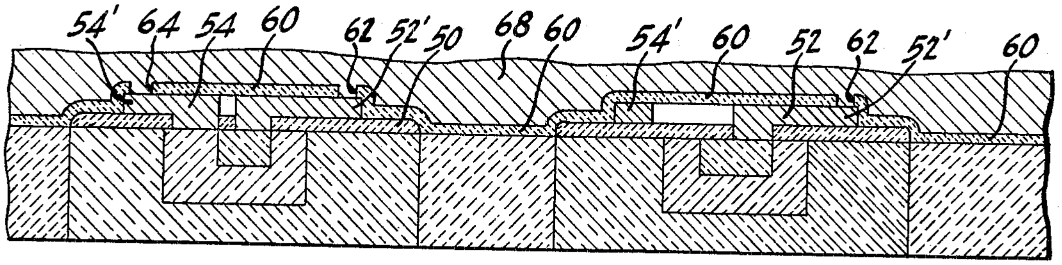
FIG. 6 is a view similar to FIG. 4 but at a later step in the processing of the wafer.

A relatively thick layer 68, e.g. 100,000 angstroms, of a metal such as aluminum, nickel, tungsten, copper, or the like, is then deposited onto the surface of the workpiece. As shown in FIG. 6, the metal layer 68 covers the layer 60 and extends through the openings 62 and 64 (and 66, not shown) therein into contact with the pads 52' and 54'. The metal layer 68 can be vapor deposited or sputtered onto the workpiece resulting in the layer 68 being firmly bonded to the pads 52' and 54'.

Figure 7:
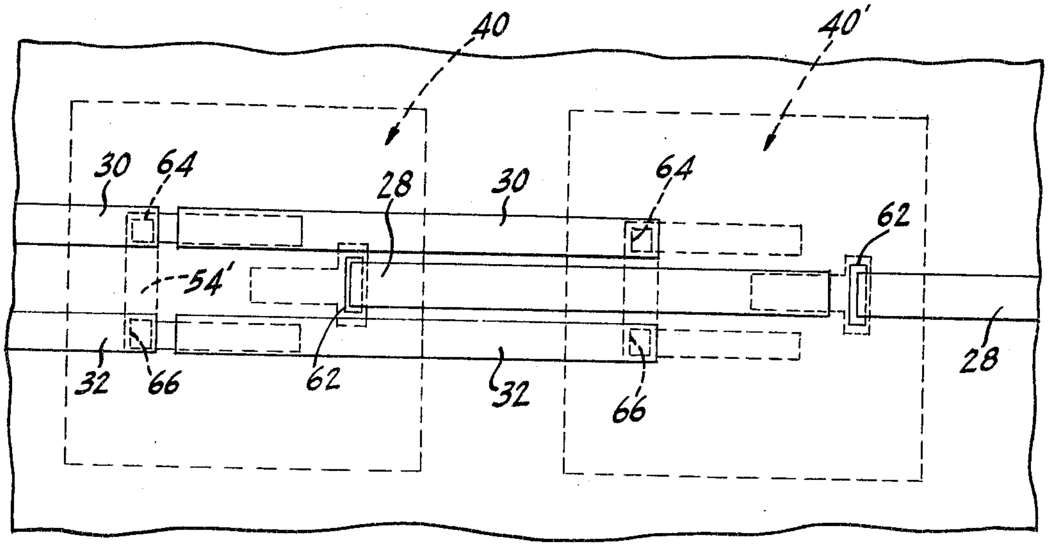
FIG. 7 is a view similar to FIG. 5 but at a still later step in the processing of the wafer.

The metal layer 68 is then coated with a further layer of a photosensitive material, such as KPR, not shown, and the pattern of leads 28, 30, and 32, shown in FIG. 7, is then formed. The lead pattern can be provided using known photolithographic and etching processes. Each lead 28, 30, and 32 extends beyond the edge of the device 40 or 40' to which the lead is attached and over an adjacent device. The leads from adjacent devices are interdigitated to provide long leads while still allowing close spacing of the wafer devices 40, 40'. This provides for efficient utilization of the wafer surface. In this embodiment, the openings 64 and 66 in the photosensitive layer 60, through which the leads 30 and 32 are respectively connected to the bonding pad 54', are spaced apart to allow the lead 28 from an adjacent device (e.g. the device 40) to pass therebetween and extend over substantially most of the width of the device 40'. The presence of the underlying layer 60 (FIG. 6) isolates each device from the overlapping leads from adjacent patterns.

An alternate method of forming the leads 28, 30, and 32 is to deposit the metal on the wafer through a suitable mask. The leads are thus defined by the mask, and separate photolithographic and etching processes are not used.

Figure 8:
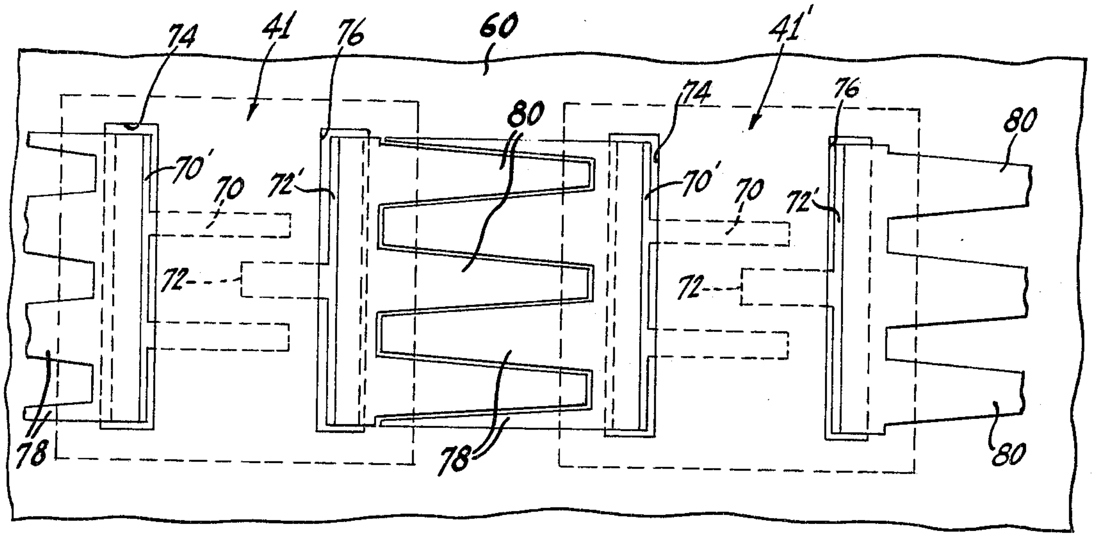
FIG. 8 is a view similar to FIG. 7 but showing a modification thereof.

FIG. 8 shows another example of an interdigitated lead device. As in the embodiment shown in FIGS. 3 and 4, each device 41 and 41' comprises conductive areas or contacts 70 and 72 engaged with electrodes of the device. Each contact 70 and 72 is provided with an elongated bonding pad 70' and 72', respectively. Elongated openings 74 and 76 are provided in the insulating material layer 60 exposing or uncovering the bonding pads 70' and 72', respectively. Connected to each of the bonding pads 70' and 72' through the openings 74 and 76 is a set of leads 78 and 80, respectively. As in the embodiment shown in FIG. 7, the leads 78 and 80 of adjacent devices are interdigitated, with the leads from each pattern extending at least partly over the adjacent device.

The leads from each device, however, do not extend over the bonding pads of the adjacent devices. This tends to result in greater device yield since it avoids the possibility of contact between the leads and the bonding pads therebeneath through random openings, known in the art as "pin holes," through the insulating material layer 60. While means are known for minimizing the prevalence of pin holes, devices which are less affected by the presence of pin holes are generally preferred.

The interdigitation of the leads 78 and 80 provides the devices 41 and 41' with leads which extend beyond the edges of the devices while still allowing close spacing between adjacent devices. This provides a high yield of pellets from the semiconductor wafers.

After formation of the lead devices on the surface of the wafer workpiece, the workpiece is subdivided into individual pellets each having a set of leads extending beyond the edges thereof. One means to accomplish this is to cover the bottom surface of the wafer with a layer of photosensitive material, and to define in the photosensitive material, by known photolithographic processes, orthogonal grooves corresponding to the spaces between the rows and columns of devices on the upper surface of the wafer. The wafer material between the devices is then etched away working upwards through the grooves in the photosensitive material. After the silicon wafer is etched through, the devices are completely separated by etching or dissolving away the insulating material layer 60 underlying the leads.

Another method, preferred because of its greater speed and reliability, is to scribe the bottom surface of the wafer 13 in a pattern corresponding to the pattern of spaces between the wafer devices 40, 40', and to crack the wafer along the scribed lines. Due to the presence of the layer 60 of insulating material, the cracking operation does not break the leads which extend over the cracks between adjacent devices. To finally separate the devices, the insulating material layer 60 is etched or dissolved away.

Figure 9:
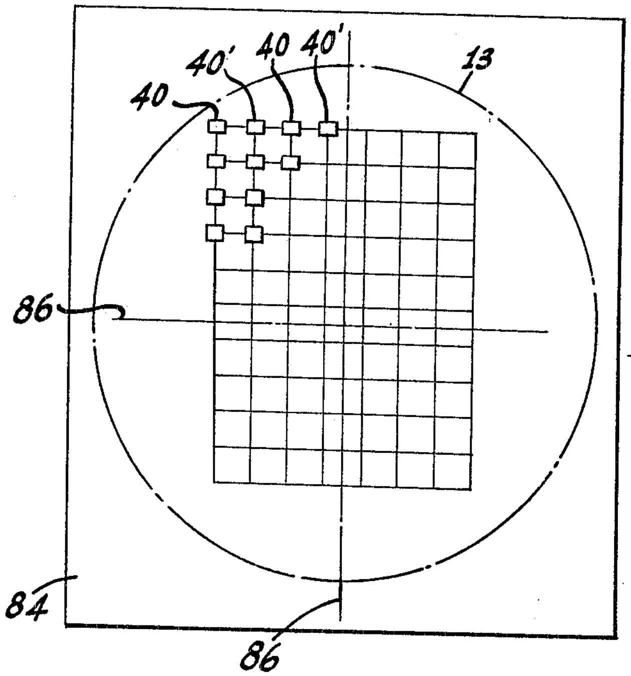
FIG. 9 is a bottom view of a transparent substrate having a semiconductor wafer mounted thereon.

A convenient method of scribing the bottom surface of the wafer 13 is as follows. The wafer workpiece is mounted, working surface down, on a transparent glass substrate 84, as shown in FIG. 9. The assembly is then turned over and the bottom surface of the substrate is scribed with a pair of orthogonal axes 86 corresponding to the orthogonal pattern of spaces between the wafer devices. The scribed axes are made to extend beyond the edges of the wafer. Thereafter, the assembly is again turned over and the bottom surface of the wafer is scribed using the scribed axes on the substrate as a guide.

The wafer is then removed from the substrate and is cracked in usual fashion.

After the underlying insulating material layer 60 has been removed, and the wafer segmented into pellets, the integral leads 28, 30, and 32, and 78 and 80, are secured to the devices only where the leads extend through the insulating material layer 60 and are bonded to the device electrodes. In the mounting of the pellets, in a mount of the type shown in FIGS. 1 and 2, for example, the leads can be bent upwardly and away from the pellet surfaces. The increased distance between the leads and the pellet surface decreases the capacitive coupling between the electrodes connected to the leads and the other pellet electrodes.

Although not illustrated, the invention has particular utility in high frequency devices having a plurality of separate base and emitter electrodes which are connected together in various combinations by means of conductive contacts on the surface of the wafer. Examples of such devices are described, for example, in "The Overlay Transistor, Part 1," Electronics Magazine, Aug. 23, 1965, pages 71–77. Electrical connections to the conductive contacts can be made by means of integral leads of the type herein described. Improved performance of such high frequency devices is obtained as a result of the use of the present invention. For example, because of the high degree of uniformity of lead size and shape and accuracy of lead spacing and positioning obtainable through the use of the photolithographic techniques used in the present invention, an equal distribution of current to the device electrodes, e.g. the emitter, is obtained. This results in improvements in the power gain performance of the devices. Also, because of the low lead inductance obtained through the use of the relatively thick and wide leads, obtainable as herein described, a further improvement in power gain performance is obtained.

Further, high efficiency performance of such devices is provided as a result of the decreased electrode capacitance obtained by the lifting of the leads from the wafer surface. Also, in the securing of the integral leads to the contacts, as described, smaller sized contacts can be used than are conventionally required for the bonding of connector wires to the devices. This further reduces electrode capacitance.

We claim:

1. A method of fabricating semiconductor devices comprising:

preparing a semiconductor pellet having a first layer of insulating material on a surface thereof, an electrode within said pellet, and a conductive contact on said first layer electrically connected to said electrode;

coating said first layer and said contact with a second layer of insulating material, and providing an opening through said second layer to uncover said contact;

depositing a layer of metal on said second layer and on said uncovered contact;

removing portions of said metal layer to define a lead on said second layer connected to said contact; and removing said second layer from under said lead to provide a cantilevered lead.

2. A method of fabricating semiconductor devices comprising:

providing a plurality of spaced devices on a semi-conductor wafer, each of said devices including an electrode, a first layer of insulating material on the top surface of said wafer, and a conductive contact on said first layer in electrical contact with said electrode;

coating said wafer with a second layer of insulating material, and providing openings through said second layer to uncover a portion of each of said contacts;

depositing a layer of metal on said second layer and on said uncovered contact portions;

removing portions of said metal layer to define a pattern of interdigitated leads on said second layer, each of said leads being connected to a contact and extending beyond the edge of the device to which it is connected and over an adjacent device; and segmenting said wafer into individual pellets each having a lead extending beyond an edge of the pellet.

3. A method of fabricating semiconductor devices as in claim 2 wherein the step of segmenting said wafer comprises:

scribing lines in the bottom surface of said wafer in a pattern corresponding to the pattern of spaces between said devices;

cracking said wafer along said scribed lines; and etching away said second layer.

4. A method of fabricating semiconductor devices comprising:

providing a plurality of spaced devices on a semiconductor wafer, each of said devices including first and second electrodes, a first layer of insulating material on the top surface of said wafer, and first and second conductive contacts on said first layer in electrical contact with said first and second electrodes, respectively;

coating said wafer with a second layer of insulating material, and providing openings through said second layer to uncover two spaced portions of each of said first contacts and a portion of each of said second contacts;

depositing a layer of metal on said second layer and on said uncovered portions of said contacts;

removing portions of said metal layer to define a repeated pattern of spaced leads on said second layer, said pattern comprising a pair of first leads each of which is connected to a different portion of said first contact, and a second lead connected to said second contact, each of said leads extending beyond the edges of the device to which it is attached, and the second lead of each device extending between the pair of first leads and over the first contact of a device adjacent to said each device; and segmenting said wafer into individual pellets each having a group of leads extending beyond an edge of the pellet.

5. A method of fabricating semiconductor devices as in claim 4 wherein the step of segmenting said wafer comprises:

scribing lines in the bottom surface of said wafer in a pattern corresponding to the pattern of spaces between said devices;

cracking said wafer along said scribed lines; and etching away said second layer.

References Cited

UNITED STATES PATENTS

| | | | |
|---|---|---|---|
| 3,436,611 | 4/1969 | Perry. | |
| 3,377,513 | 4/1968 | Ashby et al. | 29—578 X |
| 3,345,210 | 10/1967 | Wilson | 117—212 |
| 3,258,898 | 7/1966 | Garibotti | 29—577 |
| 3,247,428 | 7/1966 | Perri et al. | 29—577 |
| 3,054,709 | 9/1962 | Freestone et al. | 156—17 |
| 3,046,176 | 7/1962 | Bosenberg | 156—17 X |
| 2,978,804 | 4/1961 | Soper et al. | 156—17 X |

ALFRED L. LEAVITT, Primary Examiner

A. M. GRIMOLDI, Assistant Examiner

U.S. Cl. C.R.

156—17; 29—591, 583; 117—217